United States Patent [19]

Udofot

[11] Patent Number: 5,005,004
[45] Date of Patent: Apr. 2, 1991

[54] LIGHT ACTIVATED VEHICLE SENSOR WITH FLASHING LIGHT AND PULSING SOUND ALARM

[76] Inventor: Michael P. Udofot, 1346 LaSalle Ave. S., Minneapolis, Minn. 55403

[21] Appl. No.: 260,597

[22] Filed: Oct. 21, 1988

[51] Int. Cl.$^5$ .............................................. G08B 21/00
[52] U.S. Cl. .................................. 340/600; 362/802; 340/942; 340/432; 340/474; 250/214 R
[58] Field of Search ............ 340/600, 942, 432, 474, 340/468, 932, 902; 250/206.1, 214 AL, 214 D, 214 R; 362/802, 72, 61

[56] References Cited

U.S. PATENT DOCUMENTS

| | | | |
|---|---|---|---|
| 3,221,317 | 11/1965 | Ferrigno et al. | 340/600 |
| 3,765,006 | 10/1973 | Takahashi et al. | 340/600 |
| 3,875,527 | 4/1975 | Garcia | 340/600 |
| 3,886,352 | 5/1975 | Lai | 340/942 |
| 3,909,819 | 9/1975 | Radford | 340/600 |
| 3,930,249 | 12/1975 | Steck et al. | 340/600 |
| 4,249,160 | 2/1981 | Chilvers | 340/902 |
| 4,255,745 | 3/1981 | Rohan et al. | 340/600 |
| 4,290,047 | 9/1981 | Latta, Jr. | 340/432 |
| 4,613,103 | 9/1986 | Waranowitz | 340/942 |

OTHER PUBLICATIONS

Davies, "Versatile Light Alarm"; *Radio & Electronics Constructor;* vol. 29, #3, pp. 142–144; 10/75.
*Heathkit Electronics Dictionary;* pp. 470–471 (Multivibrator Definition & Figure).

*Primary Examiner*—Joseph A. Orsino
*Assistant Examiner*—Jill Jackson

[57] ABSTRACT

An audible warning tone and a flashing optical signal are generated by a personal portable signalling apparatus when it detects the approach of a lighted moving vehicle. The flashing optical signal also alerts the operator of the moving vehicle of the presence of the user of the personal portable signalling apparatus. A housing is provided to optically isolate the receiving and transmitting portions of the optical apparatus.

5 Claims, 6 Drawing Sheets

LIGHT ACTIVATED VEHICLE SENSOR WITH FLASHING LIGHT AND PULSING SOUND ALARM

BACKGROUND OF THE INVENTION (a) Field of the Invention

This invention is light-signaling alarm device.

(b) The Prior Art

Public awareness and concern for night safety is increasing. Visibility is a problem for those operating motor-vehicles at night. It is difficult to see pedestrians, bikers, joggers or vice versa. This concern for safety has always curtailed night activities. Therefore, the need to safeguard the public against accidents during night or dark hours has increased dramatically. In the prior art, many safety tips and devices, such as, wearing white clothing has been found to reduce pedestrian's accident probabilities by approximately forty-eight percent (48%). Reflective clothing and tapes have been found to improve the probability that pedestrians will be seen by drivers at night. Swinging a flashlight back and forth will increase visibility as well. Tieing safety reflective lights to a limb of a body, as taught in U.S. Pat. No. 1,594,510. Another U.S. Pat. No. 1,774,457 illustrates the technique of illuminating a roadside sign to respond to vehicle lights at night. Another U.S. Pat. No. 3,893,000 shows the illumination of highway lighting on passing vehicles. Apparatus for both lighting and signaling has been shown in U.S. Pat. No. 4,408,182. Other U.S. Pat. Nos. 4,117,457 and 4,290,047 disclose a system measuring the speed of an incident light source of an approaching vehicle. However prior art lacked the compactness and was ineffective and very expensive to manufacture and maintain. In U.S. Pat. Nos. 4,290,047 and 4,117,457 there is shown system for detecting and measuring the speed of an incident light source. The complexity of this system renders it ineffective and inefficient for use by the general public. For example, Latta's circuits in U.S. Pat. Nos. 4,290,047 and 4,117,457 require two photocell components, a MOSFET transistor, and a Darlington amplifier, several resistive and capacitive components. Also there are digital distance speed logic and display parts. Even without including the so called digital distance, speed logic and display parts, the cost of Latta's circuit is expensive when considering manufacturing cost.

Another deficiency in Latta's circuit design is that the system has two photocell components. One of them (34) is used for detecting an incident light source and another one (42) is included so as to be primarily sensitive to ambient light as shown in FIG. 2 of U.S. Pat. No. 4,290,047 (Latta). But, when the general ambient light levels at least as great as the light incident upon the photocell (34), such as on well lighted streets or parking lots, the resistances of both photocells (34) and (42) become low. In this state, the system consumes power without giving any signals. The reasons of power losses occuring are that low resistances in photocells are the resistance of resistor (44) as well a the interbase resistance of MOSFET. Thus the power of batteries in Latta's circuits (U.S. Pat. Nos. 4,117,457 and 4,290,047) are consumed in an undesirable situation.

The present invention has avoided such drawbacks, which are observed in Latta's circuits and other prior art patents. The purpose of this invention includes a compact device which is easy to operate, cheaper, inexpensive to manufacture, effective and efficient for the general use of the public. This invention, however, is simplified. It only needs one photocell, one IC chip, four resistors, two capacitors, one speaker, one bulb and two switches. The cost of manufacturing is very low. On the other hand, the internal circuit connections and complexities of this new invention are considerably simplified. Again, the reliability of this invention is fairly increased at the same time. It is also part of this new invention to have a variable resistor connected to one photocell and ground to form a voltage divider and adjust the sensitivity of the photocell to avoid power consumption during undesirable situations. By comparison, the prior art including the Latta references (U.S. Pat. Nos. 4,117,457 and 4,290,047) do not have a capacitor for varying the frequency of the amplifier. The only means possible to change the value of the resistance of the photocells (34) or (42) of Latta's circuits is by the light striking those photocells. That is not the case with this new invention where variable resistor $R_1$ in FIG. I is adjusted to a particular value and is not dependent upon a light striking the photocell (CDS). Another feature in this new invention over Latta's system is a feature that permits independent adjustment of the resistance in the circuit through $R_1$ in FIG. I, without being interfered with by any change in the amount of light striking the photoresistor. Although this invention is entirely different from Latta's system, the comparisons are made to outline the prior art's flaws, drawbacks and problems. It is part of this invention to alleviate the problems encountered by the public in their search for a better device that would help protect members of the public against accident and crime on the road at night by offering a safety device which operates to provide an audible and visible alarm simultaneously. The differences and improvements made over the prior art references in this new invention can further be explained by again including the fact Latta claimed in his invention that when the variable resistor is also a photo sensitive element, it cannot be adjusted independently of light striking the photo sensitive element. However, with this new invention, it can be adjusted independently. The capacitor $C_2$ in this new invention has a dual role, because it acts with $R_5$ to serve as a feedback circuit of the lower circuit network through adjustment, and at the same time provides an integration function that shapes the wave-form with respect to the time of the voltage crossing the lamp (L) and the terminal of the speaker (S). The dual role played by capacitor $C_2$ which has resulted in allowing the amplifier circuit to provide an integrated voltage with respect to the time of the voltage crossing the lamp (L), and at the same time applied that integrated voltage to the series connected terminal on the speaker (S), the resulting effect will be a clear, distinctive tone with better quality of sound than may be obtained if the speaker S is connected in parallel with the lamp. The preference is for a clear, distinctive and better quality sound generated from the speaker (S) instead of a clicking noise as produced by the prior art references. This new invention allows the speaker and light bulb to operate simultaneously. The Latta references do not teach or suggest the simultaneous operation of the speaker (S) and the lamp (L) nor would it be obvious to one skilled in the art to do so in view of the Latta references. The prior art inventions relate to a measuring device whose variables are the photo-cells and the level of light incident on them. It has a logic board for which the output will result in a distance measurement when calibrated. This present invention is a light-triggered device that turns the oscillators "on" and "off" given several variables such as $R_1$, $R_2$, CDS, $C_1$, $C_2$, $R_3$, $R_4$, $R_5$ and these variables co-operate by functioning through adjustments to operate both audio and visual warnings simultaneously. This new invention has an amplifier output with an emmiter driver which is not an obvious choice of circuit for even one of ordinary skill in the art. This new invention produces a better quality sound than that produced by the prior art and gives a better response regardless of how it's being carried.

SUMMARY OF THE INVENTION

It is part of this invention to alleviate the problems encountered by the general public in their search for a better device that would help protect members of the public especially, joggers, bikers, hikers, other pedestrians and motor-vehicle operators against accident and crime on the road during nights or dark hours by offering them a safety/warning device which operates simultaneously to provide an audible and visible alarm elements or warning signals.

When the photocell detects enough light to trigger the lamp flasher oscillator, a flashing light will be generated at lamp L. A pulse signal is introduced to the base of $TR_3$ from the lamp L through the resistor $R_5$ that serves to turn "on" and "off", the audio oscillator in synchronism with the flashing of lamp L. The resistors and $C_1$ in the upper circuit, when properly adjusted will permit the lamp L to flash at a first frequency while if $R_5$ and $C_2$ are also properly adjusted to give $$f_o = \frac{1}{R_5 C_2} = 3000 \text{ Hz}$$

in the lower circuit, a better tone of sound equal to 3000 Hz will be produced at the speaker S. The result will be a "flashing lamp" and a "beeping tone" generated in a simultaneous manner. The overall design of this invention has allowed for a reliable operation while minimizing the cost and the number of components used in manufacturing. In further considerations to reducing the cost of manufacturing, and increasing the reliability, flexibility and affordability levels of the new warning device to the general public, another simplified new circuit is shown in FIG. 2.

The number of resistors and transistors are reduced in FIG. 2. Again, since the new FIG. 2 circuit uses one integrated circuit (1C chip), MPQ6001 or MPQ6002, the circuit connection length and complexities are considerably reduced in such that the reliability and flexibility of the new device is increased. Furthermore, the cost and size of the device is also reduced because the 1C chip is low in cost and small in size when comparing with the anolog components. Also, due to the regularity of the integrated circuit in FIG. 2, the circuit layout and positioning can be easily made so that the labor cost is reduced during production of the newly invented device, thus increasing the efficient of production.

The plastic housing is shown in FIGS. 5 through 10. At the bottom view, (FIG. 10), there is a circular clear plastic window (15) that permits a light to demonstrate the flashlight function. There is a circular window (14) for light sensing by the photocell (CDS), in the upper part of the front panel of the plastic case (FIG. 5). Switches for the warning device power source and flashlight are accomodated in the small holes (16) and (17) symmetrically drilled on both sides of the case (FIGS. 7 and 8). Similar to the warning function of a traffic light, an amber (or red) plastic plate (18) (may be domed-shape or flat) is fitted in the lower part of the front panel, so that warning lamp of this invention may also appear as amber (or red) when it is being activated (FIG. 8). A magnet (19) may be inlaid to assist in mounting the device to magnetic (metalic iron or steel) bodies, such as those of automobiles (FIG. 6). A belt clip (20), penlike in nature with screw hole (21), and a carrying strap (22) are attached to the back view of the plastic body with the help of a ring (23) to the carrying or mounting the newly invented warning device virtually anywhere (FIG. 6).

Walking, jogging, biking or hiking safely at night is possible with the present invention. When the headlights of an on-coming vehicle are sensed by the photocell, it causes the triggering of a bright flashing light. The amber (or red) light will flash at a rate of 15 times per every 10 seconds and is easily visible for over 100 meters. In this fashion the vehicle is warned of the carriers presence. At the same time, the speaker S is energized to produce a buzzing high-pitched alarm cautioning the carrier that traffic is approaching. This invention is also intended to warn others and draw attention to one's situation during hazardous situations, such as, motor-vehicle breakdowns, camping, hiking or hunting problems, and may send S.O.S. in case of any emergency as a signal distress.

DESCRIPTION OF THE PREFERRED EMBODIMENTS

Figure 1:
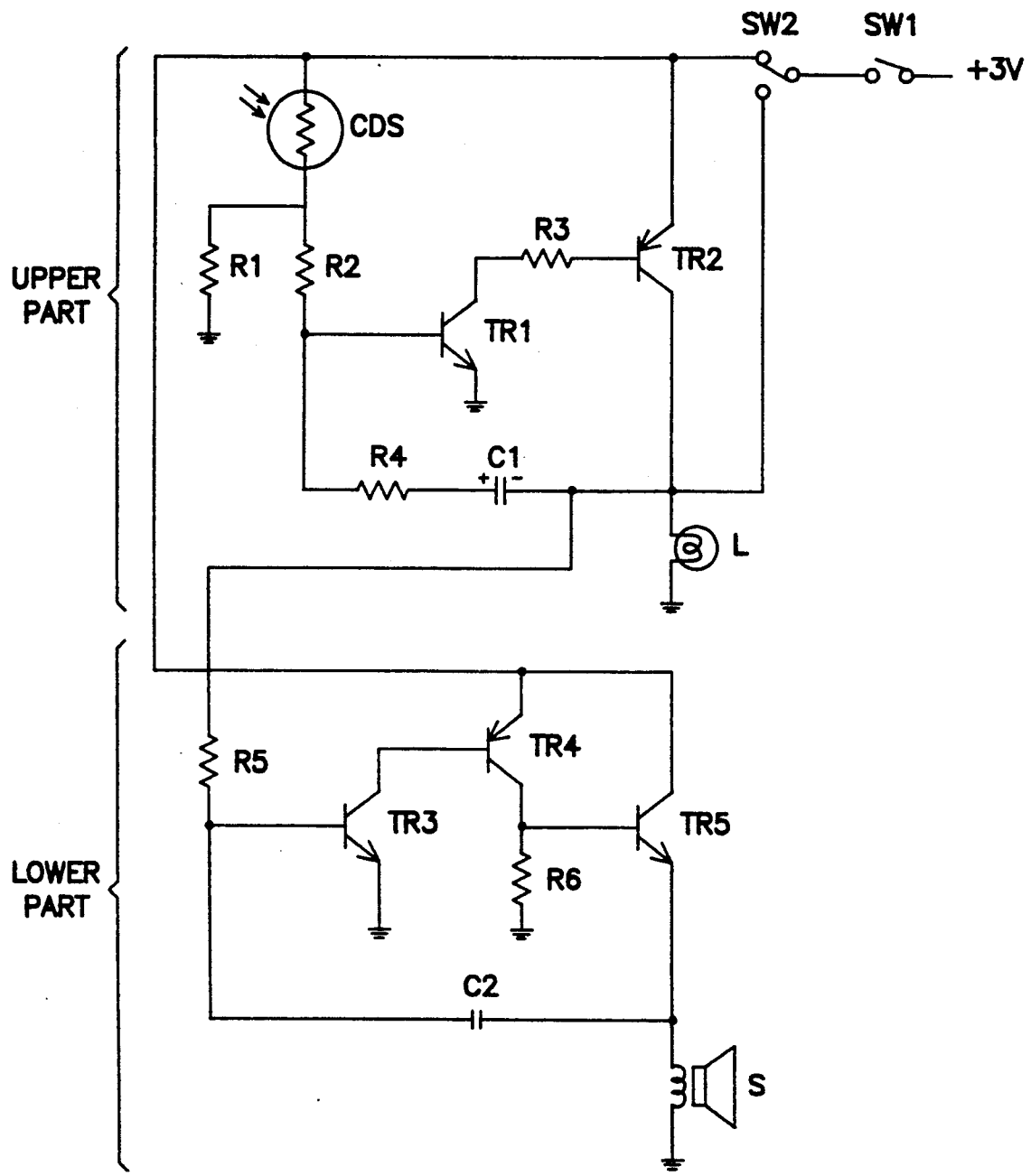
FIG. 1 is a schematic diagram of one embodiment of the invention.

The theory of this warning device invention is explained here in detail with the attached schematic diagrams in FIG. I and 2. The electric power source is obtained from 3.0±0.4 V D.C. battery. There is about 430 uA current passing through the lighted bulb and about 50 uA passing through the photo-resistor "CDS" in the dark. A typical value of the resistance of a photo-resistor in the dark is about one million ohms. This value can decrease to several thousands ohms when it is illuminated with high intensity light. In FIG. I, transistors $TR_1$ and $TR_2$ are connected to the photo-resistor "CDS". These three components $TR_1$, $TR_2$ and CDS function as an oscillatory electric circuit which is controlled by the photo-resistor "CDS". The resistance of the "CDS" depends on the intensity of an incident light in order to operate. Resistors $R_1$, $R_2$, and CDS serve to bias the base of $TR_1$. In the dark, the resistance of CDS is very high, therefore, the current of the base is cut off, and $TR_1$ is therefore shut off. Since there is no bias voltage, $TR_2$ is shut off also. On the other hand, when CDS is triggered by an incident light, the resistance of CDS becomes low. The network of CDS and $R_1$ supplies base voltage to $TR_1$, and the current collected at $TR_1$, will trigger $TR_2$ to reach oscillation. The adjustment of $R_1$ will control both the sensitivity of CDS and the oscillating frequency. The periodicity of the flashing light will be controlled by adjusting the resistor $R_4$ and capacitor $C_1$ which are connected to the base of $TR_1$ and collector of $TR_2$ since $R_4$ and $C_1$ serve as a feedback network of the oscillating lamp flasher circuit. The amplification circuit, which consists of $TR_3$, $TR_4$ and $TR_5$ will obtain enough power when the pulse signal, which is generated by the flashing light, is amplified through $TR_3$-$TR_4$-$TR_5$ network, to drive the speaker (S) to generate sound. The resistor $R_5$ and capacitor $C_2$ serve as a feedback network to adjust the frequency of the sound. Thus FIG. I is a schematic diagram which shows a light triggered device which has a visible and an audible warning signals that are operating simultaneous as one unit.

The operation of this circuit is best explained by dividing the schematic diagram into two parts (upper and lower parts). The upper part of FIG. I is an oscillating lamp flasher which is controlled using a "CDS" photoresistor cell. The frequency of the oscillator is determined by the component values of $R_1$, $R_2$, $R_4$, $C_1$, the resistance of lamp L ($R_L$) and the variable resistance of the "CDS" ($R_{CDS}$) The frequency is calculated using equation number I below:

$$f_c = \frac{1}{T_c} = \left(\left[\frac{R_1}{R_L + R_{CDS}} + R_2 + R_4\right]C_1\right)^{-1} \quad (1)$$

The typical value of the resistance of a photo-resistor in the dark is about one million ohms. As the incident light level increases, the resistance of the "CDS" goes down proportionately. Since the acutal resistances of the cells will vary great, $R_1$ is included in the schematic diagram to allow calibration of the oscillator's sensitivity to light. When the "CDS" is in darkness, it has a very high resistance. The result is that $TR_1$ is cut-off and $C_1$ is therefore charged very slowly. When $TR_1$ is cut-off, the base of $TR_2$ cannot sink any current and thus, is also cut-off preventing the lamp from lighting. Since the resistance of "CDS" is very high, the frequency of oscillation is very small and the flashing rate is unobservable. As the resistance of the "CDS" drops, due to an incident light that is stronger, the capacitor $C_1$ charges more quickly $$T_c = \frac{1}{f_c}$$

Once the resistance of "CDS" drops below to about one half of the value of $R_1$, the flashing rate will become rapid enough to be observable. As $C_1$ charges up, the voltage across the base-emitter junction of $TR_1$ increases proportionately. Once this voltage reaches a value of about 0.6 volts, the collector of $TR_1$ will begin to drain current from the base of $TR_2$. The result will be a proportional current forced from the collector of $TR_2$ which will drive the lamp L to generate light and the voltage supplied from the lamp L during this phase of operation in the upper part of FIG. 1 will then exceed that of the base-emitter junction of $TR_1$. The capacitor $C_1$ will be discharged, resulting in $TR_1$ being cut-off and again forcing $TR_2$ to turn-off which will result in the lamp L to extinguish. $C_1$ will discharge at the rate of $T_D = C_1 R_L$; where $R_L$ is the resistance of the lamp. Once the lamp goes out, the entire cycle is repeated. This will continue until the resistance of "CDS" rises above the value determined by one half of $R_1$.

The lower part of FIG. I is an amplification circuit or an audio oscillator schematic which functions in much the same manner as the oscillating lamp flasher. When the votage supplied with the pulse signal that is introduced to the base of $TR_3$ from the lamp L through the resistor $R_5$ is high (2.8 volts), this oscillator will function normally, but when the voltage is low ($<1.0v$), then no oscillation will occur. This oscillator is dependent and controlled by the pulse signal that is introduced to the base of $TR_3$ from the lamp L through the resistor $R_5$. The pulse signal serves to turn the audio oscillator "on" and "off" in synchronism with the flashing of lamp L. The transistor $TR_5$, which is added to the network is essentially required to provide the additional power needed to drive the speaker S at a controllable and reasonable volume. Resistor $R_5$ and capacitor $C_2$ serve as a feedback network in which the frequency of the sound can be controlled by adjusting $R_5$ and $C_2$. The frequency of the lower part of FIG. I, which is the audio oscillator is calculated by using equation number 2 below:

$$f_o = \frac{1}{R_5 C_2} \quad (2)$$

The capacitor $C_2$ has a dual role in this invention, because it acts with $R_5$ to serve as a feedback of the lower circuit network through adjustment and at the same time provides the remainder of the transistor elements an integration function that shapes the wave form with respect to time of the voltage across the lamp L and the voltage at the terminal of the speaker S.

$$k \int v_1 dt.$$

With the dual role played by capacitor $C_2$ which has resulted in allowing the lower circuit to provide an integral, with respect to time of the voltage across the lamp L, and at the same time applied that integrated voltage to the series connected terminal of the speaker S, resulting in a clear, distinctive present invention which is preferable in this invention to that obtained if the speaker S was connected in parallel with the lamp L. By preferable is meant a clear, distinctive and better quality tone of sound generated from the speaker S instead of a clicking noise.

With the insight of how the upper and lower parts of the schematic in FIG. I function, their combined operation can now be explained as follows: when the "CDS" detects enough light to trigger the lamp flasher oscillator, a flashing light will be generated at lamp L. A pulse signal is introduced to the base of $TR_3$ from the lamp L through the resistor $R_5$ that serves to turn the audio oscillator on and off in synchronism with the flashing of lamp L. The resistors and $C_1$ in the upper circuit, when properly adjusted will permit the lamp L to flash at ~

Figure 2:
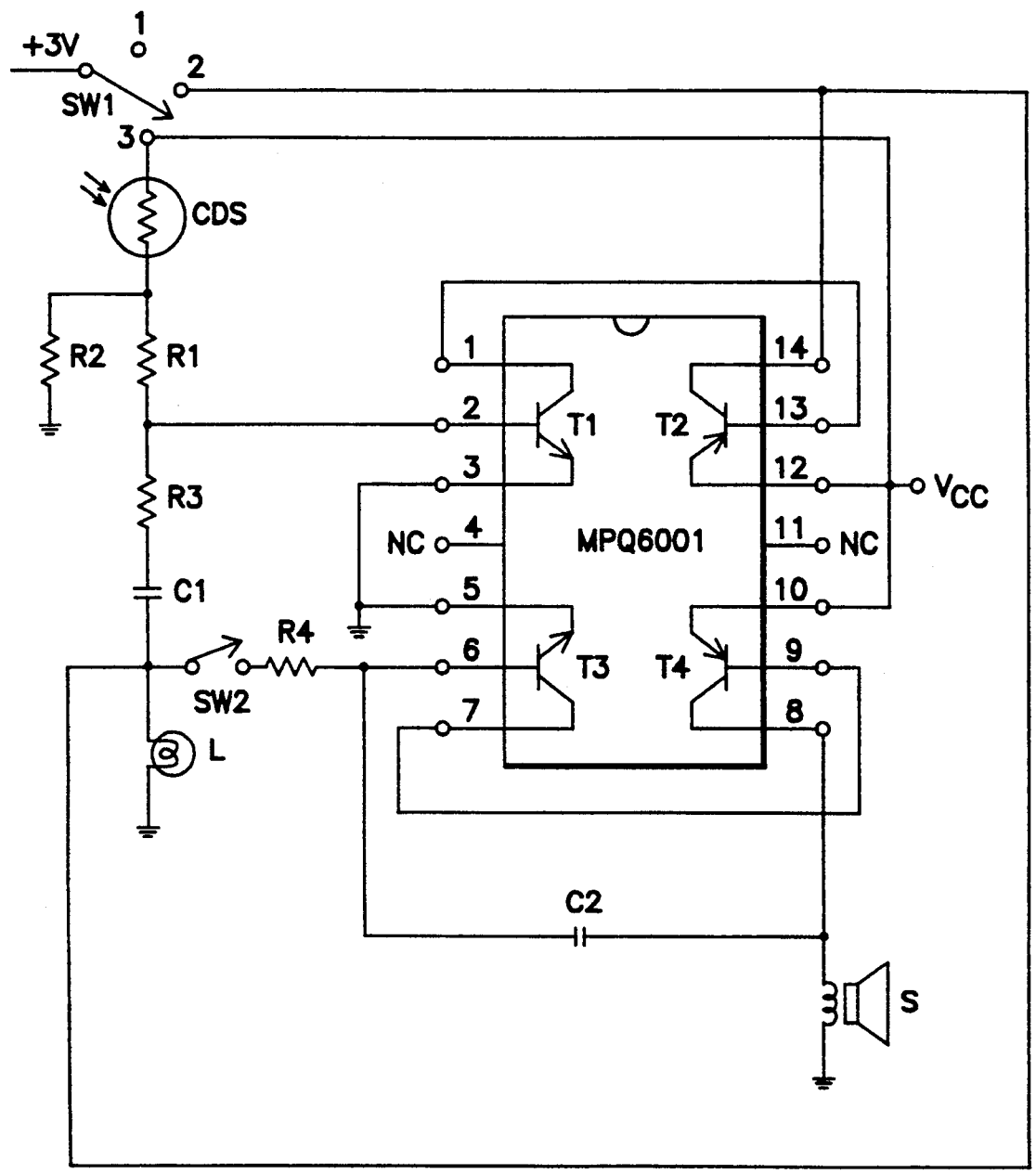
FIG. 2 is a schematic diagram of a second embodiment of the invention.
Figure 3:
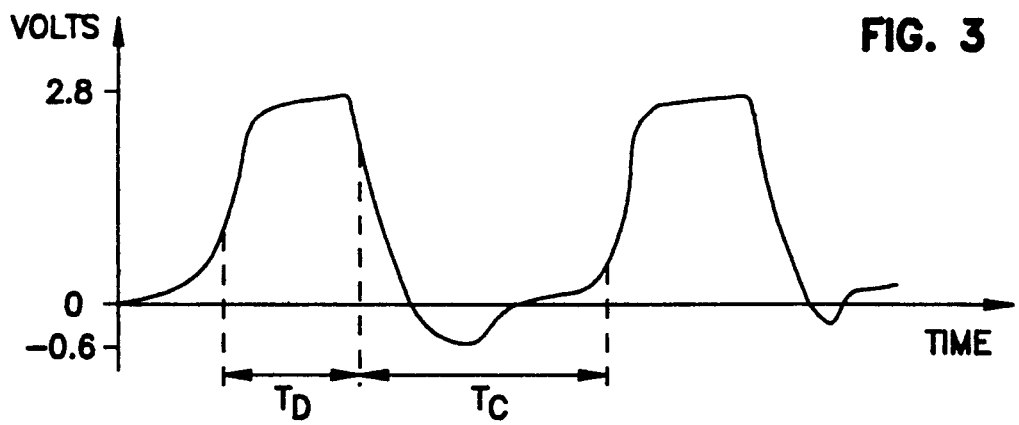
FIG. 3 illustrates the wave form of the output voltage.
Figure 4A:
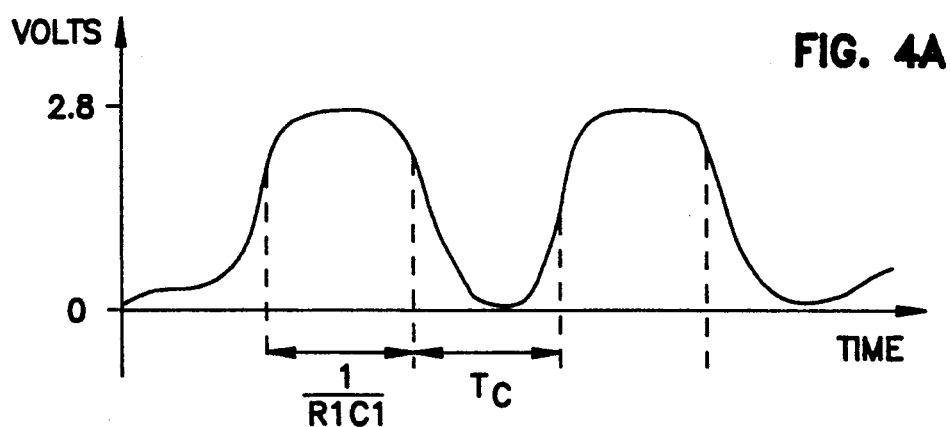
FIG. 4 (a–c) are the illustrations of the signal waveforms.
Figure 4B:
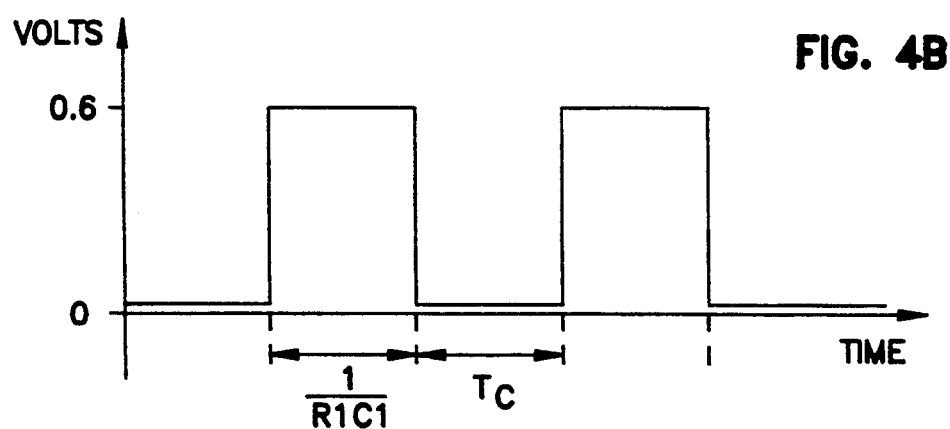
Figure 4C:
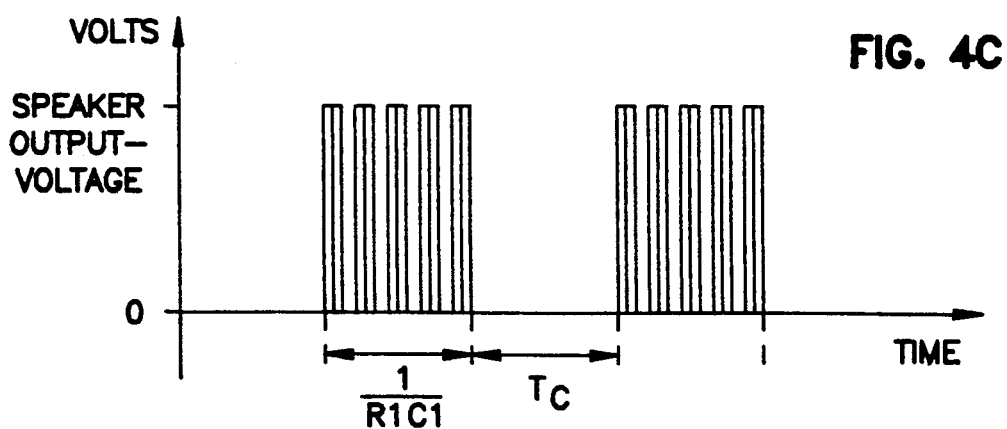
Figure 6:
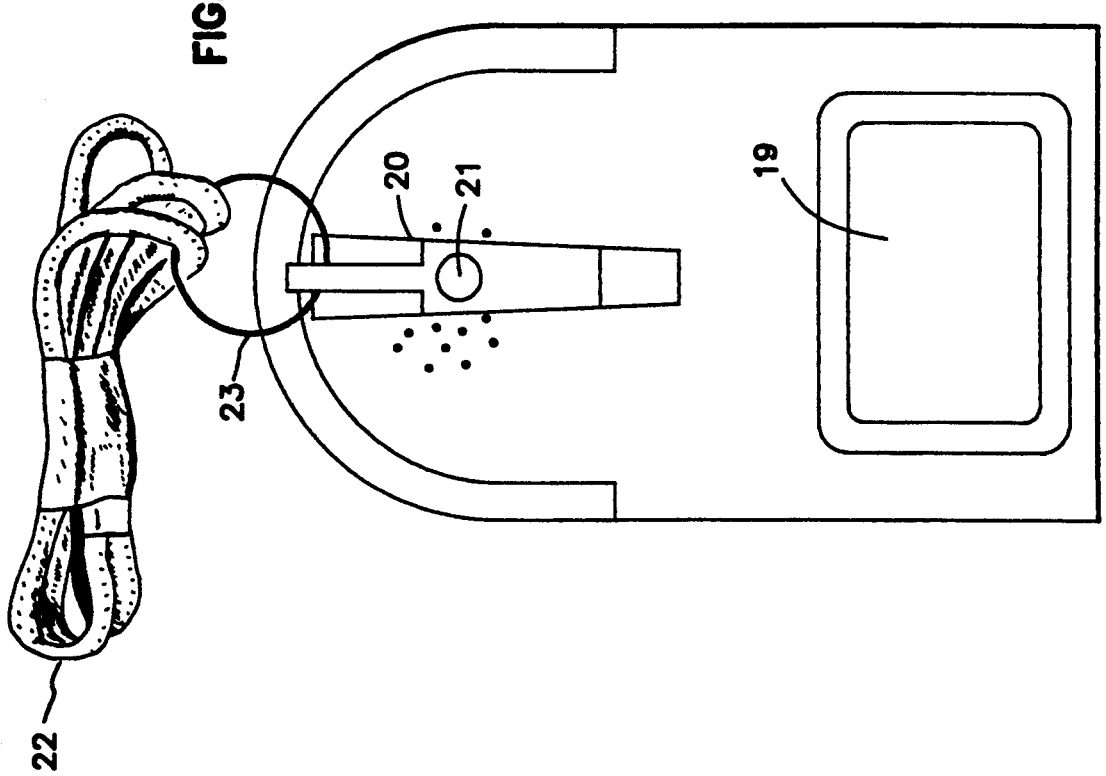
FIG. 6 illustrates the back view of the plastic housing.
Figure 5:
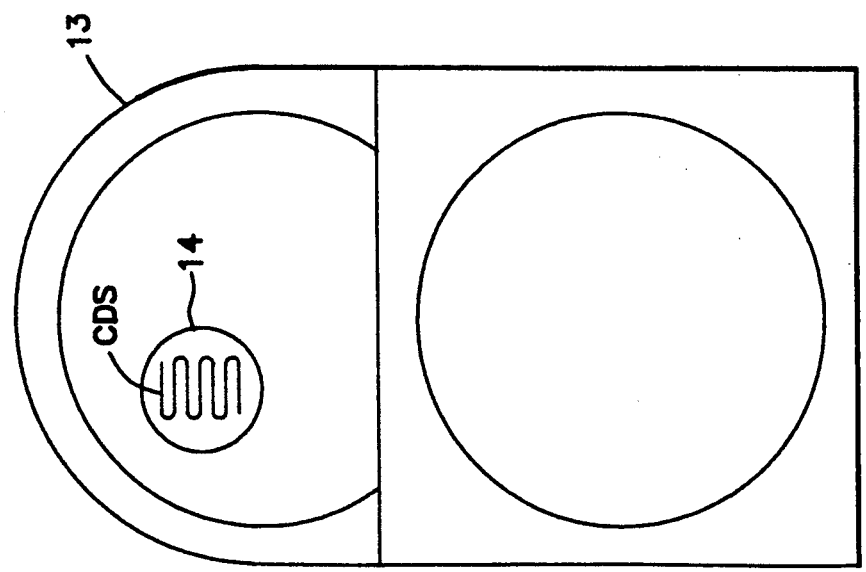
FIG. 5 illustrates the front view of the plastic housing.
Figure 7:
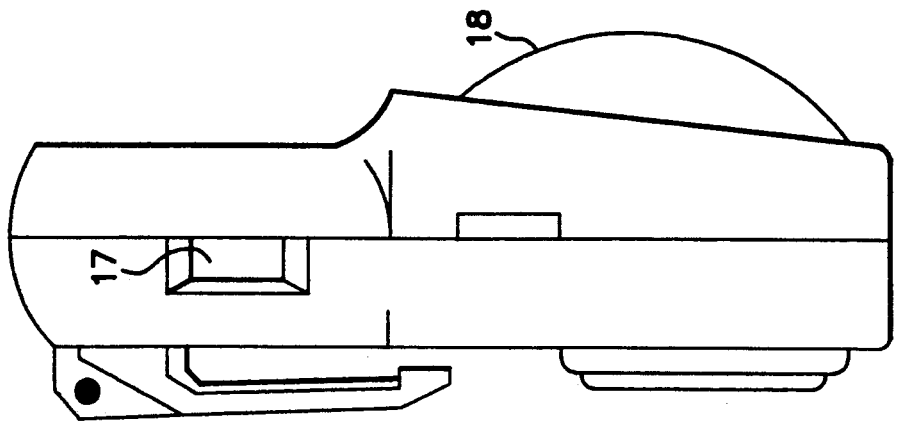
FIG. 7 illustrates the right side view of the plastic housing.
Figure 8:
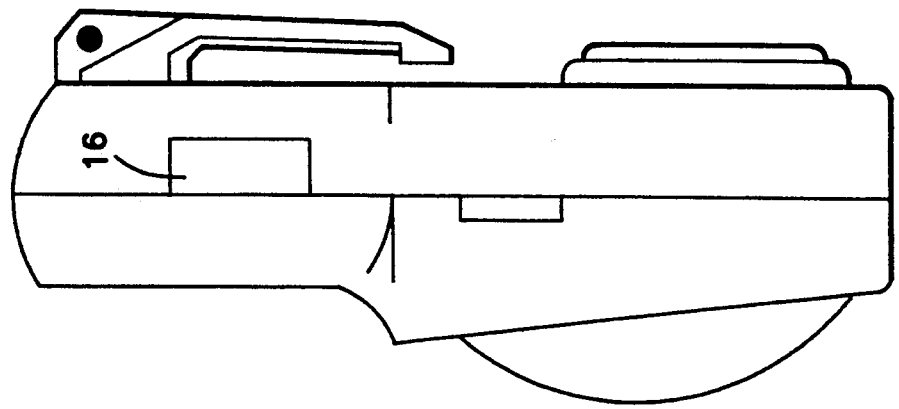
FIG. 8 illustrates the left side view of the plastic housing.
Figure 9:
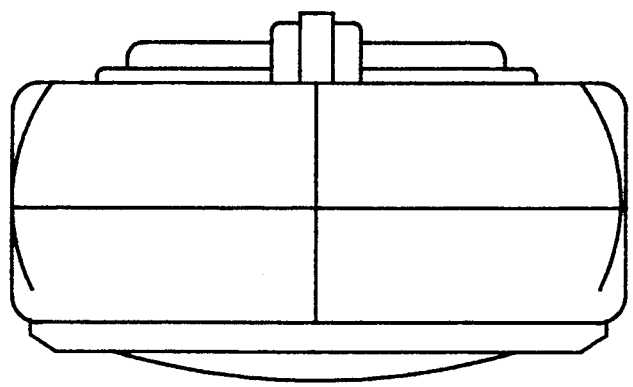
FIG. 9 illustrates the top view of the plastic housing.
Figure 10:
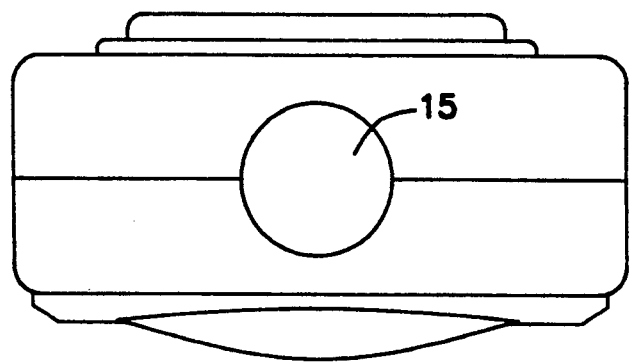
FIG. 10 illustrates the bottom view of the plastic housing.

/cycle/second, while if $R_5$ and $C_2$ are also properly adjusted in to give $$f_o = \frac{1}{R_5 C_2} = 3000 \text{ Hz}$$

in the lower circuit, a better tone of sound equal to 3000 Hz will be produced at the speaker S. The result will be a "flashing lamp" and a "beeping tone" generated in a simultaneous manner from the present invention. In further consideration of reducing the manufacturing cost and increasing the reliability, flexibility and affordability levels of the new warning device, an alternative circuit is shown in FIG. 2. Because of the regularity and reliability of the [MPQ6002]integrated circuit (1C chip), the circuit layout can be easily manufactured, thus a reduction in labor cost and the increase in production efficiency are achieved. Of course, the labor cost reduction and efficiency are things the prior art lacked.

The fundamental working principle of the new circuit in FIG. 2 is described as follows:

The photo-resistor, CDS, is used as a photo-electronic transducer, which varies it's resistance from 1m ohms (1m$\Omega$) in the dark to several k ohms with light intensity, depending on the intensity of the incident light which strikes the photo-resistor, CDS. The switch, $S_1$ controls the system which may be operated at four different states, which are:

A completely "off" state.

A state of simultaneous blinking and beeping, to cause an audio and a visual warning alarm signals, when an incident light source is detected.

A state of blinking without beeping to cause a visual warning alarm signal when an incident light source is detected. The operator or carrier is given a degree of freedom and choice of any needed warning signal, given both audio and visual warning alarm signals.

An "on" state which permits the system to provide a light source at night or whenever light is needed by the operator or carrier, thus a flash light function is also achieved.

Since the resistance value of the photo-resistor. CDS, is very high in the dark, the bias current of transistor $T_1$ within the integrated circuit (C chip-MPQ6002) is almost equal to zero, and $T_1$ stays in a cut off state. Because $T_1$ is coupled with $T_2$ which is also within the integrated circuit (1C chip-MPQ6002), $T_2$ is also shut off due to the zero bias current. At this point, the integrated circuit (1C chip-MPQ6002) is a quad complementary pair of transistor array which contains both pNp and NpN Silicon transistor in a 14-pin dual-in-line plastic package. On the other hand, the resistance of the photo-resistor, CDS, becomes low when it is struck by an incident light beam. Resistive voltage division network ($R_1$, $R_2$ and CDS) provides a bias voltage for $T_1$ therefore $T_1$ is turned on. The current collected at $T_1$ triggers $T_2$ to be turned on also. Resistor $R_3$ and capacitor $C_1$ connected in series to the base of $T_1$ and collector of $T_2$ acts as a feedback network to adjust the flashing rate of the lamp L. The value of $R_2$ can control the sensitivity of photo-resistor and determine the repetition oscillating frequency which causes the lamp L to flash at the same rate. The power drive and oscillatory circuit consists of $R_4$, $C_2$, $T_3$ and $T_4$ to provide sufficient power to drive the speaker (buzzer) S to beep. The pulse signal generated by the flashing lamp L is amplified through the $T_3$, $T_4$ network and the speaker is driven to beep. $R_4$, $C_2$ network serves as a feedback network to adjust the beeping frequency. When $S_2$ is open, the warning system will only blink without beeping. The power supply is from two double A size batteries.

The circuit of FIG. 2 may be manufactured from the following electronic parts and components Four resistors: $R_1$=15K, $R_2$=10K, $R_3$=2.2K, $R_4$=47K. ¼ watt for all four resistors: 5% carbon film or 5% metal oxide film resistors.

Two capacitors: $C_1$=22uF, 16 volts and $C_2$=0.047uF, 25 volts. Radial lead aluminum eletrolytic capacitors.

Two switches: $S_1$=three position-DP-3 pos and $S_2$=two position-DPDT slide switches.

One convergent lamp L (bulb): (1.5~3vdc).

One buzzer (speaker) S: (1.5~3vdc).

One integrated circuit: 1C chip (MPQ6002 or MPQ6001).

One photo-resistor: CDS.

This new design eliminates drawbacks of the prior art such as power losses due to low valve resistors and the interbase resistance of MOSFET transistors. Also number of resistors and transistors are reduced in FIG. 2 of this invention. Again, since the new circuit (FIG. 2) uses one integrated circuit (1C chip), MPQ6002, the circuit connection length and complexities are considerably reduced in such that the reliability and flexibility of the device is increased.

What is claimed is:

1. A light activated signaling system for detecting the presence of a lighted moving vehicle and signaling the presence of the signaling system to the operator of the moving vehicle and for indicating the presence of the moving vehicle to the operator of the signaling system comprising:

a power supply for powering said system, said power supply having a positive supply terminal and a ground potential terminal;

light detector means responsive to light projected by said moving vehicle, for generating a light detection signal in response to the reception of light projected from said moving vehicle;

first oscillator means having an on state and an off state, connected to said power supply and also coupled to said light detector means for generating first repetitive power pulses at a first frequency, during said on state in response to said light detection signal, and not generating said repetitive power pulses, during said off state representative of the absence of said light detection signal, light source means connected to said first oscillator means for converting said first repetitive power pulses to light pulses and for projecting said light pulses toward said moving vehicle;

second oscillator means coupled to said first oscillator means for generating second power pulses at a second fixed frequency higher than said first frequency, in response to said on state, said second oscillator means operating during the one state of said first oscillator means and not operating during said off state;

audio transducer means coupled to said second oscillator means for converting said second power pulses to sound energy, wherein said light detector means comprises, a photo resistive detector (CDS) connected in series with a variable resistor ($R_1$) across said power supply terminal (+3,gnd) the junction between said photo-resistive detector and said variable resistor defining a control node, wherein said first oscillator means comprises a first npn transistor (TR$_1$) having a base, a collector and an emitter;

a second npn transistor (TR$_2$) having a base, a collector and an emitter, said emitter being connected to said positive supply terminal (+3V);

a bias resistor (R$_2$) connected between said base of said first transistor and said control node for supplying a bias current to said first transistor when said photo-resistive detector is illuminated;

a base supply resistor (R$_3$) connected between said collector of said first transistor and said base of said second transistor for supplying current to the base of second transistor (TR$_2$);

a series connected timing resistor (R$_4$) connected to a timing capacitor (C$_1$) forming a feed base path connected between said base of said first transistor (TR$_1$) and said collector of said second transistor (TTR$_2$), whereby said first repetitive power pulses are produced at said first frequency, whereby said first frequency is proportional to the time constant of said feedback path, at said collector of said second transistor (TR$_{10}$) when said photo-resistive detector biases said first transistor TR$_1$ into conduction.

2. A light activated signaling system for detecting the presence of a lighted moving vehicle and signaling the presence of the signaling system to the operator of the moving vehicle and for indicating the presence of the moving vehicle to the operator of the signaling system comprising:

a power supply for powering said system, said power supply having a positive supply terminal and a ground potential terminal;

light detector means responsive to light projected by said moving vehicle, for generating a light detection signal in response to the reception of light projected from said moving vehicle;

first oscillator means having an on state and an off state, connected to said power supply and also coupled to said light detector means for generating first repetitive power pulses at a first frequency, during said on state in response to said light detection signal, and not generating said repetitive power pulses, during said off state representative of the absence of said light detection signal, light source means connected to said first oscillator means for converting said first repetitive power pulses to light pulses and for projecting said light pulses toward said moving vehicle;

second oscillator means coupled to said first oscillator means for generating second power pulses at a second fixed frequency higher than said first frequency, in response to said on state, said second oscillator means operating during the one state of said first oscillator means and not operating during said off state;

audio transducer means coupled to said second oscillator means for converting said second power pulses to sound energy, wherein said light detector means comprises, a photo resistive detector (CDS) connected in series with a variable resistor (R$_1$) across said power supply terminals (+3,gnd) the junction between said photo-resistive detector and said variable resistor defining a control node, wherein said second oscillator means comprises, a third transistor (TR$_3$), having a base, a collector, and an emitter, said emitter being connected to ground potential;

a fourth transistor (TR$_4$), having a base, a collector, and an emitter, said emitter being connected to said positive supply terminal (+3V);

a fifth transistor (TR$_5$), having a base, a collector, and an emitter, said collector being connected to said positive supply terminal (+3V);

a connection to said first oscillator means, whereby bias current is supplied to said base of said third transistor when said first oscillator is in the on state;

a timing capacitor (C$_2$) connected between said base of said third transistor and ground potential terminal for supplying feedback to said third transistor;

a connection between said collector of said third transistor and said base of said fourth transistor for switching said fifth transistor into conduction at a rate set by said timing resistor (R$_5$) and said timing capacitor (C$_2$) which defines said second frequency.

3. A light activated signaling system for detecting the presence of a lighted moving vehicle and signaling the presence of the signaling system to the operator of the moving vehicle and for indicating the presence of the moving vehicle to the operator of the signaling system comprising:

a photo-resistive light sensor (CDS) having first and second leads, said first lead being connected to a positive supply (Vcc);

a first resistor (R$_1$) having first and second leads, said first lead being connected to said second lead of said photo-resistive sensor;

a second resistor (R$_2$) having first and second leads, said first lead being connected to second lead of said first resistor, said second lead being connected to ground potential;

a first NPN transistor having a base, an emitter, and a collector, said emitter being connected to ground, said base being connected to said second lead of said first resistor (R$_1$);

a third resistor (R$_3$) having first and second leads, said first lead being connected to said base of said first transistor;

a first capacitor (C$_1$) having a first and a second lead, said second lead being connected to said second lead of said third resistor (R$_3$);

a second PNP transistor (T$_2$) having a base, a collector, and an emitter, said base being connected to said collector of said first transistor, said collector being connected to said first lead of said first capacitor;

a third NPN transistor (T$_3$) having a base, a collector and an emitter, said emitter being connected to ground potential;

a fourth resistor (R$_4$) having a first lead and having a second lead, said first lead being connected to said first lead of said first capacitor said second lead being connected said base of said third transistor;

a second capacitor (C$_2$) having first and second leads, said first lead being connected to said base of third transistor;

a fourth transistor having a base, an emitter and a collector, said collector being connected to said second lead of second capacitor, said base being connected to said collector of said third transistor, said emitter being connected to said emitter of said fourth transistor.

4. A light activated signaling system for detecting the presence of a lighted moving vehicle and signaling the presence of the signaling system to the operator of the moving vehicle and for indicating the presence of the moving vehicle to the operator of the signaling system comprising:

a power supply for powering said system, said power supply having a positive supply terminal and a ground potential terminal;

light detector means responsive to light projected by said moving vehicle, for generating a light detection signal in response to the reception of light projected from said moving vehicle;

first oscillator means having an on state and an off state, connected to said power supply and also coupled to said light detector means for generating first repetitive power pulses at a first frequency, during said on state in response to said light detection signal, and not generating said repetitive power pulses, during said off state representative of the absence of said light detection signal, light source means connected to said first oscillator means for converting said first repetitive power pulses to light pulses and for projecting said light pulses toward said moving vehicle;

second oscillator means coupled to said first oscillator means for generating second power pulses at a second fixed frequency higher than said first frequency, in response to said on state, said second oscillator means operating during the on state of said first oscillator means and not operating during said off state;

audio transducer means coupled to said second oscillator means for converting said second power pulses to sound energy, wherein said light detector means comprises, a photo resistive detector (CDS) connected in series with a variable resistor ($R_1$) across said power supply terminals (+3,gnd) the junction between said photo-resistive detector and said variable resistor defining a control node;

wherein said first oscillator means comprises, a first npn transistor ($TR_1$) having a base, a collector and an emitter;

a second npn transistor ($TR_2$) having a base, a collector and an emitter, said emitter being connected to a positive supply (+3V);

a bias resistor ($R_2$) connected between said base of said first transistor and said control node for supplying a bias current to said first transistor when said photo-resistive detector is illuminated;

a base supply resistor ($R_3$) connected between said collector of said first transistor and said base of said second transistor for supplying current to the base of second transistor ($TR_2$);

a series connected timing resistor ($R_4$) connected to a timing capacitor ($C_1$) forming a feed back path connected between said base of said first transistor ($TR_1$) and said collector of said second transistor ($TR_2$), whereby said first repetitive power pulses are produced at said first frequency, whereby said first frequency is proportional to the time constant of said feedback path, at said collector of said second transistor ($TR_2$) when said photo-resistive detector biases said first transistor $TR_1$ into conduction;

housing means for isolating said light detection means from said light source means.

5. A light activated signaling system for detecting the presence of a light moving vehicle and signaling the presence of the signaling system to the operator of the moving vehicle and for indicating the presence of the moving vehicle to the operator of the signaling system comprising:

a power supply for powering said system, said power supply having a positive supply terminal and ground potential terminal;

light detector means responsive to light projected by said moving vehicle, for generating a light detection signal in response to the reception of light projected from said moving vehicle;

first oscillator means having an on state and an off state, connected to said power supply and also coupled to said light detector means for generating first repetitive power pulses at a first frequency, during said on state in response to said light detection signals, and not generating said repetitive power pulses, during said off state representative of the absence of said light detection signal, light source means connected to said first oscillator means for converting said first repetitive power pulses to light pulses and for projecting said light pulses toward said moving vehicle;

second oscillator means coupled to said first oscillator means for generating second power pulses at a second fixed frequency higher than said first frequency, in response to said on state, said second oscillator means operating during the on state of said first oscillator means and not operating during said off state;

audio transducer means coupled to said second oscillator means for converting said second power pulses to sound energy, wherein said light detector means comprises, a photo resistive detector (CDS) connected in series with a variable resistor ($R_1$) across said power supply terminals (+3,gnd) the junction between said photo-resistive detector and said variable resistor defining a control node, wherein said second oscillator means comprises, a third transistor ($TR_3$), having a base, a collector, and an emitter, said emitter being connected to ground potential; a fourth transistor ($TR_4$), having a base, a collector, and an emitter, said emitter being connected to said positive supply (+3V);

a fifth transistor ($TR_5$), having a base, a collector, and an emitter, said collector being connected to said positive supply (+3V);

a connection to said first oscillator means, whereby bias current is supplied to said base of said third transistor when said first oscillator is in the on state;

a timing capacitor ($C_2$) connected between said base of said third transistor and ground potential terminal for supplying feedback to said third transistor;

a connection between said collector of said third transistor and said base of said fourth transistor for switching said fifth transistor into conduction at a rate set by said timing resistor ($R_5$) and said timing capacitor ($C_2$) which defines said second frequency;

housing means for isolating said light detection means from said light source means.

* * * * *